United States Patent [19]

Didden

[11] Patent Number: 5,296,262
[45] Date of Patent: Mar. 22, 1994

[54] METHOD OF PROVIDING A PASTE FOR A CERAMIC MULTILAYER ACTUATOR

[75] Inventor: Henricus A. C. Didden, Eindhoven, Netherlands

[73] Assignee: U.S. Philips Corporation, New York, N.Y.

[21] Appl. No.: 929,068

[22] Filed: Aug. 12, 1992

[30] Foreign Application Priority Data

Aug. 14, 1991 [EP] European Pat. Off. ........ 91202076.5

[51] Int. Cl.$^5$ .............................................. B05D 5/12
[52] U.S. Cl. .................................. 427/125; 427/126.3; 427/376.2; 427/430.1; 427/443.2; 427/284
[58] Field of Search ................ 427/125, 126.3, 376.2, 427/376.6, 430.1, 443.2, 284; 118/264

[56] References Cited

U.S. PATENT DOCUMENTS 4,859,498  8/1989  Yamaguchi ............................ 427/96

*Primary Examiner*—Shrive Beck
*Assistant Examiner*—David M. Maiorana
*Attorney, Agent, or Firm*—William L. Botjer

[57] ABSTRACT

The invention relates to a method of providing a pseudoplastic paste on a substrate surface by dipping. The paste is provided in the form of a layer on a wire gauze, the layer thickness being adjusted to a desired value by means of a squeegee and a spacer. The paste layer is wiped off at the bottom side of the gauze by means of a squeegee. Subsequently, a substrate with the substrate surface to be covered is dipped in the paste layer up to the gauze and is removed again before the paste can flow over the parts of the substrate which are not to be covered. The method can be used, for example, to provide a ceramic multilayer actuator having piezoelectric layers 20 and inner electrodes 21 with end contacts 22, in such a manner that the end contacts fully cover the end faces of the actuator and that the side faces of the actuator are substantially completely left free by the end contacts.

7 Claims, 2 Drawing Sheets

METHOD OF PROVIDING A PASTE FOR A CERAMIC MULTILAYER ACTUATOR

BACKGROUND OF THE INVENTION

The invention relates to a method of providing a paste on a substrate surface by dipping.

The invention relates in particular to a method of manufacturing a ceramic multilayer actuator and to a ceramic multilayer actuator having end contacts which are manufactured by the method according to the invention.

Pastes are used, for example, for applying resistive layers or electrode layers to electric components such as resistors, capacitors and supports of semiconductor devices. According to methods which are known per se, such pastes cannot only be provided by dipping but also by screen printing.

Under the influence of an applied electric field, the dimensions of piezoelectric elements, such as actuators, may change and said piezoelectric elements may exert a mechanical force. In certain embodiments, end contacts are used to interconnect inner electrodes and to provide the connection with an external power source. Actuators are used, inter alia, in accurate positioning devices and in printers.

In U.S. Pat. No. 4,859,498 a description is given of a device for and a method of providing a silver-containing conductive paste on electronic components. The paste is applied in the form of a thin layer to a flat plate, after which the electronic components are dipped in the paste. Subsequently, the end contacts thus formed are baked. According to an alternative embodiment, the paste is contained in a porous member such as, for example, a sponge.

According to the known method, end contacts are formed about the end portions of the electronic component in such a manner that also a part of the side faces of the component is covered. This is desirable for many applications, for example, for components which are to be soldered on a printed circuit board. For other applications, however, such as for ceramic actuators which can be stacked and interconnected to attain a cumulative mechanical effect, it may be necessary to leave the side faces of the component uncovered. Another disadvantage of the known method is that, in general, the surface of the end contact formed is not completely flat, which can be ascribed to the manner in which the paste loosens itself from the surface when the component is removed from the paste after the dipping operation.

SUMMARY OF THE INVENTION

It is an object of the invention to provide, inter alia, a method of providing a paste on a substrate surface, in which method the surface to be coated is completely covered up to the desired edges, and in which coating beyond the edges is minimized. It is an object of the invention to provide a method which can be carried out at a high speed and with great accuracy. A further object of the invention is to provide a uniformly distributed paste layer whose surface is as flat as possible. The invention more particularly aims at providing electronic components such as ceramic multilayer actuators which can be suitably stacked on top of each other and interconnected.

These objects are achieved by a method as described in the opening paragraph, which method is characterized according to the invention in that a pseudoplastic paste is used which is provided in the form of a layer on a wire gauze, which paste layer is wiped off at the bottom side of the gauze by means of a squeegee and, subsequently, a substrate with the substrate surface to be coated is dipped in the paste layer up to the gauze and is removed again before the paste can flow over the parts of the substrate which are not to be covered.

Preferably, the thickness of the paste layer is adjusted to a desired value by means of a squeegee and a spacer and, simultaneously, the paste layer is wiped off at the bottom side.

For the manufacture of a ceramic multilayer actuator, a conductive paste is provided which is subsequently converted to an end contact by means of a thermal treatment.

A ceramic multilayer actuator which is manufactured according to the above-described method is characterized according to the invention in that the end contacts fully cover the end faces of the actuator and in that the side faces of the actuator are substantially completely left free by the end contacts.

A pseudoplastic material is characterized by a high viscosity at low deformation rates and a low viscosity at high deformation rates. Once a paste having such properties has been deposited, it stops flowing. Efficacious materials for use in the method according to the invention have a viscosity of, for example, between 400 and 600 Pa.s at a deformation rate of $0.1$ $s^{-1}$, and a viscosity between 10 and 40 Pa.s at a deformation rate of $100$ $s^{-1}$. When such a material is used, the dipping time ranges preferably between 0.25 and 0.50 s, during which time the paste can sufficiently flow out over the surface to be covered, without covering the side faces of the product.

To carry out the dipping step in the method according to the invention, a device as described in the above-mentioned U.S. Pat. No. 4,859,498 may be used, if desired. According to an alternative method it is also possible to position the product to be covered above the gauze with the paste layer, after which the wire gauze is locally pressed upwards by moving a roller or wheels along the bottom side of the gauze.

It is known per se to provide a paste on the surface of a substrate through a mesh (screen printing), but such a method is comparatively slow because the paste has to be pressed through the mesh and can hardly be carried out in such a manner that the substrate is accurately covered up to the edges without also the side faces being partially covered. Besides, the screen-printing technique is unsuitable for applying layers to small discrete components.

BRIEF DESCRIPTION OF THE DRAWING

The invention will be explained in greater detail by means of an exemplary embodiment and an accompanying drawing, in which FIGS. 1A, 1B, 1C, 1D diagrammatically show a number of steps in the method according to the invention.

DETAILED DESCRIPTION OF THE PREFERRED EMBODIMENT

Exemplary embodiment

FIG. 1 is a diagrammatic cross-sectional view of a wire gauze 1 on which a layer 2 of a conductive paste is provided. According to the example, the gauze used had a mesh size of 140 μm, and the wires had a thickness of 36 μm. The layer thickness 3 of the paste on the wire gauze was adjusted to a value of 50 μm by means of a hard squeegee, for example of stainless steel, and a spacer. The spacer consisted of a number of strips of an adhesive foil having the desired thickness which were arranged parallel to each other and attached to the gauze, the paste being provided between the strips.

According to the exemplary embodiment, a paste was used consisting of 70% by weight of a silver-palladium powder mixture (weight ratio Ag/Pd was 70/30), 5% by weight of glass particles having dimensions ranging between 1 and 2 μm, 2% by weight of ethyl cellulose as the binder to which 2-ethoxy-ethyl acetate is added as the solvent. The composition of the glass particles was as follows: 37% by weight PbO, 18% by weight $B_2O_3$, 22% by weight $SiO_2$, 11% by weight ZnO, 3% by weight $Al_2O_3$, 1.5% by weight $Na_2O$ and 7.5% by weight BaO. The viscosity of the paste was 500 Pa.s at a deformation rate of 0.1 $s^{-1}$ and 20 Pa.s at a deformation rate of 100 $s^{-1}$, both values were measured at a temperature of 20° C.

In the method according to the invention, in principle, any desired paste can be used, such as a silver conductive paste or a resistive paste, the viscosity being adaptable, if required, to the desired values by measures which are known per se to those skilled in the art, such as the choice of the nature and quantities of the binder and the solvent as well as the choice of the particle size of the metal powder and the glass particles.

Figure 1A:
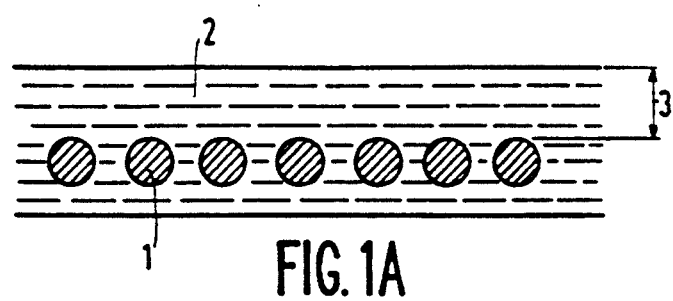
Figure 1B:
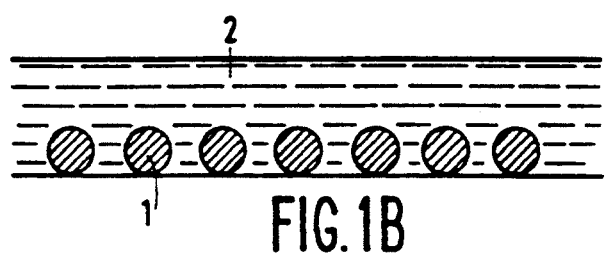

The bottom side of the wire gauze 1 was wiped off with a soft, for example rubber, squeegee up to the gauze so that the paste layer was interrupted at the bottom side, see FIG. 1B. By virtue of this measure it is precluded that the paste layer becomes, completely or partially, detached from the substrate surface to be covered when the latter is removed from the paste after dipping. Due to the rate of the dipping process and the viscosity of the paste, the latter can be insufficiently pulled along by the substrate surface unless the bottom side of the paste layer is accessible to air. The top side of the paste should form a closed layer to preclude the formation of air bubbles in the paste layer remaining on the substrate surface.

For clarity, the process steps of adjusting the layer thickness 3 and wiping off the bottom side of the paste layer up to the gauze are described as separate process steps which are carried out consecutively. By virtue of a more efficient process control of the inventive method, both process steps are preferably carried out simultaneously. In this case, the gauze is passed between a hard and a soft squeegee. The hard squeegee, for example of stainless steel, is used to adjust the layer thickness 3. The soft squeegee, for example of rubber, serves to wipe off the bottom side of the paste layer up to the gauze.

Figure 1C:
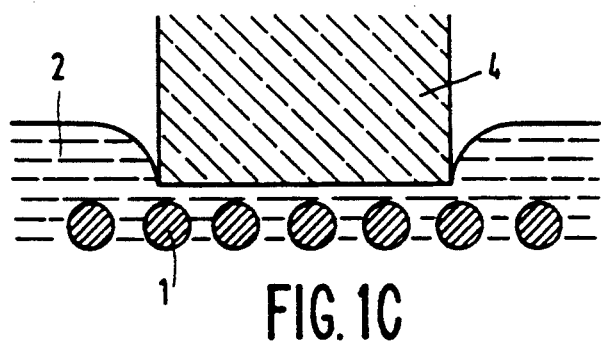

An electronic component 4 measuring 2×3.4×4 $mm^3$ was dipped in the paste layer 2 up to the wire gauze 1, see FIG. 1C, the dipping rate (dipping time 0.25 s) being such that only the substrate surface to be covered (dimensions 2×3.4 $mm^2$) was moistened. When a paste is provided on a larger substrate surface it is advisable to use a wire gauze having a larger mesh size, however, the apertures should not be so large that the paste layer applied exhibits an irregular surface. The dipping operation can be carried out using, for example, a device as described in U.S. Pat. No. 4,859,498.

Figure 1D:
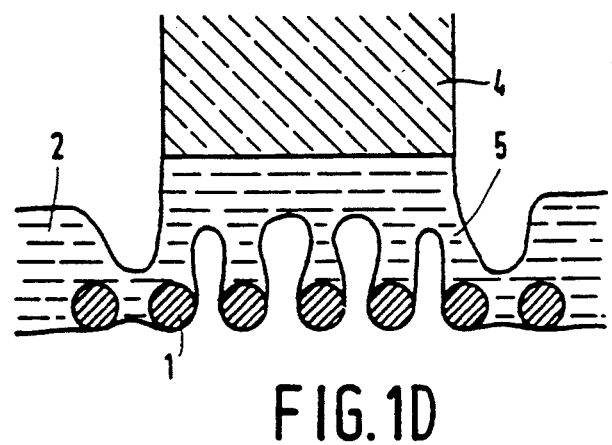

FIG. 1D shows the situation when the electronic component 4 is removed from the paste layer 2. For each screen wire 1, regular constrictions 5 were formed in the paste layer, which is in contrast with the situation obtained by dipping in a vessel or pressing onto a flat plate, in which case only one constriction is formed over the entire surface, which leads to an irregularly shaped surface of the layer applied to the component 4. The result of the method according to the invention was that a flat regular layer was provided which covered the entire surface area to be covered and which left the parts of the component which were not to be covered substantially completely free. An end contact was manufactured from the applied paste layer by baking at 800° C. for 2 hours, in which process an end contact having a thickness of 35 to 40 μm was formed.

Figure 2:
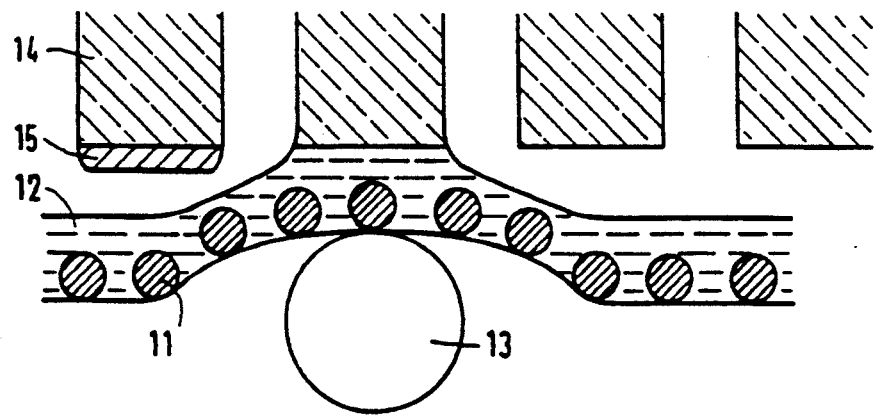
FIG. 2 shows an alternative embodiment of the method according to the invention.

FIG. 2 diagrammatically shows an alternative embodiment of the dipping step in the method according to the invention. A paste layer 12 was provided on a wire gauze 11 in a desired thickness and was wiped off at the bottom side, as described hereinabove. Subsequently, a roller 13 was moved along the bottom side of the wire gauze at a rate of approximately 50 mm/s, so that the wire gauze and the paste layer provided thereon were locally pressed upwards (displacement approximately 1 mm) and brought into contact with the electronic components 14 positioned above the wire gauze, thereby leaving a regular paste layer 15 on the electronic components, said paste layer subsequently being baked to form an end contact. The roller 13 is locally interrupted so that it does not contact the part of the gauze above which the electronic components 14 are positioned, and to ensure that the paste can be squeezed out at the bottom side of the gauze during the dipping of the components.

Figure 3A:
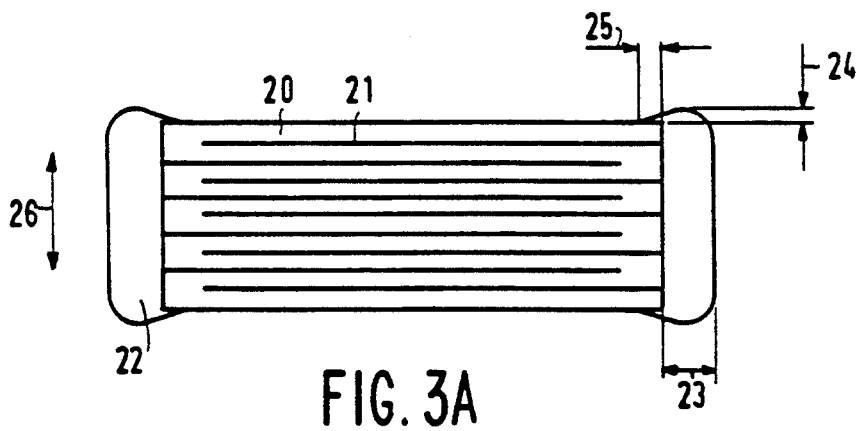
FIG. 3A and 3B are diagrammatic sectional view of a ceramic multilayer actuator according to the invention and according to the state of the art, respectively.

FIG. 3A is a diagrammatic cross-sectional view of an electronic component according to the invention, which component consists of ceramic layers 20 and inner electrodes 21. The ceramic material may be, for example, a dielectric material such as applied in a ceramic multilayer capacitor or a piezoelectric material such as applied in a ceramic multilayer actuator. The inner electrodes, which are formed of, for example, palladium, consist of at least two groups, the electrodes in one group being connected to one another and to the surroundings by means of end contacts 22. In an electronic component according to the invention, the thickness 23 of the end contact is, for example, 40 μm and the dimension 24 of the raised edge, by which the end contact exceeds the dimensions of the end face, is less than 5 μm. When the ceramic actuators are stacked in the direction 26 to obtain a cumulative action of, for example, ten actuators, the mutual distance of the components is less than 10 μm, which distance can be easily bridged by an adhesive bond. The distance 25 over which the paste has moistened the side faces of the component is less than 50 μm.

Figure 3B:
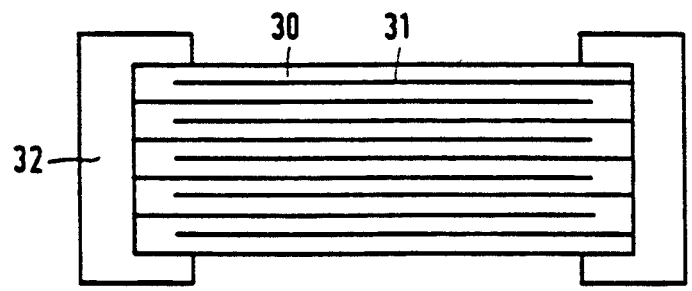

By way of comparison, FIG. 3B shows an electronic component according to the state of the art, comprising ceramic layers 30, inner electrodes 31 and end contacts 32. The end contacts do not only cover the end faces of the component but also a part of the side faces, which, in many applications, is not inconvenient or sometimes even desirable, for example in the case of components which have to be surface mounted (without leads) on a printed circuit board. Such end contacts can be manufactured from, for example, a conductive paste, for example, by means of a dipping method which is known per se or by means of screen printing. The distance over which the side faces are covered by the end contacts is usually 0.5 to 1 mm and is minimally 200 $\mu$m in the case of the prior-art dipping techniques. The thickness of the end contact is usually approximately 50 $\mu$m, both on the end face and on the side faces of the electronic component.

The method according to the invention makes it possible to manufacture end contacts which accurately cover the end face to be covered without covering the edges or side faces. This method does not require any particular screening means or masks and the method adopted is simpler and, hence, can be carried out more rapidly than, for example, screen printing.

I claim:

1. A method of providing a paste on a substrate surface by dipping, characterized in that a pseudoplastic paste is used which is provided in the form of a layer on a wire gauze, the layer thickness being adjusted by means of a squeegee and a spacer, which paste layer is wiped off at the bottom side of the gauze by means of a squeegee, and subsequently a substrate with the substrate surface to be covered is dipped in the paste layer up to the gauze and is removed before the paste can flow over the parts of the substrate which are not to be covered.

2. A method as claimed in claim 1, characterized in that the thickness of the paste layer is adjusted by means of a squeegee and a spacer and, simultaneously, the paste layer is wiped off at the bottom side.

3. A method of manufacturing a ceramic multilayer actuator having end faces characterized in that a conductive paste is provided by means of the method as claimed in claim 1, after which the conductive paste is converted to an end contact by means of a thermal treatment.

4. A method of manufacturing a ceramic multilayer actuator as claimed in claim 3, characterized in that the speed of dipping is adjusted such that the end contacts fully cover the end faces of the actuator and that the side faces of the actuator are substantially completely left free by the end contacts.

5. A method of providing a paste on a substrate surface comprising the steps of, providing a pseudoplastic paste in the form of a layer on a wire gauze, adjusting the thickness of the layer, wiping the bottom side of the gauze so that the bottom side of the layer is flush with the bottom side of the gauze and dipping the substrate surface to be covered in the paste layer up to the gauze and removing it before the paste can flow over the parts of the substrate which are not to be covered.

6. The method as claimed in claim 5 wherein the thickness of the paste layer is adjusted simultaneously with the wiping of the paste layer.

7. The method as claimed in claim 5 further including the step of thermally treating the pseudoplastic paste to convert it into another form.

* * * * *